(12) United States Patent
Liu

(10) Patent No.: US 9,958,724 B2
(45) Date of Patent: May 1, 2018

(54) SUBSTRATE AND METHOD OF FORMING PHOTORESIST LAYER

(71) Applicant: SHENZHEN CHINA STAR OPTOELECTRONICS TECHNOLOGY CO., LTD., Shenzhen, Guangdong (CN)

(72) Inventor: Guohe Liu, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 342 days.

(21) Appl. No.: 14/779,827

(22) PCT Filed: Aug. 12, 2015

(86) PCT No.: PCT/CN2015/086733
§ 371 (c)(1),
(2) Date: Sep. 24, 2015

(87) PCT Pub. No.: WO2017/024543
PCT Pub. Date: Feb. 16, 2017

(65) Prior Publication Data
US 2017/0139268 A1    May 18, 2017

(30) Foreign Application Priority Data
Aug. 10, 2015  (CN) .......................... 2015 1 0485932

(51) Int. Cl.
*H01L 21/00*     (2006.01)
*G02F 1/1335*    (2006.01)
*G02F 1/1343*    (2006.01)

(52) U.S. Cl.
CPC .. *G02F 1/133514* (2013.01); *G02F 1/133528* (2013.01); *G02F 1/133621* (2013.01);
(Continued)

(58) Field of Classification Search
CPC ......... G02F 1/133514; G02F 1/134363; G02F 1/133528; G02F 1/133621
See application file for complete search history.

(56) References Cited

U.S. PATENT DOCUMENTS 9,146,419 B1 *  9/2015  Anandan ............. G02B 6/0035
2013/0108233 A1   5/2013  Lin
(Continued)

FOREIGN PATENT DOCUMENTS

CN    103091789 A    5/2013
CN    103135281 A    6/2013
(Continued)

*Primary Examiner* — Richard Booth
(74) *Attorney, Agent, or Firm* — Ladas & Parry LLP

(57) ABSTRACT

A method of forming a photoresist layer includes: forming alignment electrodes on a base; mixing color QRs and photoresist to form a mixed material; coating the mixed material on the base; applying the base coated with the mixed material with positive and negative voltages so that the long axes of the color QRs align horizontally under the effect of the horizontal electric fields generated by the alignment electrodes; vacuum-drying the base coated with the mixed material to enhance the viscosity of the photoresist; interrupting electricity at a designated point to form a photoresist layer, wherein the long axes of QRs remain aligned horizontally; the color film substrate includes color resist films; when a backlight source emits blue light to the color film substrate, a color filter is disposed on top of the red color film to filtrate the blue light.

12 Claims, 5 Drawing Sheets

(52) U.S. Cl.
CPC .......... *G02F 1/134363* (2013.01); *G02F 2001/133531* (2013.01); *G02F 2001/133614* (2013.01); *G02F 2201/124* (2013.01)

(56) References Cited

U.S. PATENT DOCUMENTS

| | | |
|---|---|---|
| 2013/0135558 A1 | 5/2013 | Kim |
| 2015/0009440 A1 | 1/2015 | Lee et al. |
| 2016/0075943 A1 | 3/2016 | Kim et al. |
| 2016/0091649 A1* | 3/2016 | Uchiumi ............ G02B 6/005 349/61 |
| 2016/0147101 A1* | 5/2016 | Saneto ............ G02F 1/13362 349/71 |

FOREIGN PATENT DOCUMENTS

| | | |
|---|---|---|
| CN | 104680942 A | 6/2015 |
| CN | 104749681 A | 7/2015 |
| KR | 1020070107498 A | 11/2007 |

\* cited by examiner

SUBSTRATE AND METHOD OF FORMING PHOTORESIST LAYER

BACKGROUND OF THE INVENTION

1. Field of the Invention

The present invention relates to liquid crystal display (LCD) technology, and more specifically, to a substrate and a method of forming a photoresist layer.

2. Description of the Prior Art

A quantum rod (QR), like a quantum dot (QD), is a nanomaterial formed by a limited number of semiconductor atoms. Different from quasi-zero-dimensional QDs, QRs' size in one direction is larger than that in the other two directions. The structural anisotropy results in an optical anisotropy, which is unique to QR materials. The optical anisotropy refers to the differences in light absorption and light emission intensity between the long axis of the QR and the direction perpendicular to the long axis of the QR.

QRs are formed by the same materials commonly used to form QDs. Colors of the emitted light can be adjusted through the size or property of the QRs. In addition, the emission spectrum of QRs is characterized by higher luminous intensity and smaller full width at half maximum of emission peaks, which can effectively enhance color saturation and luminance when applied to liquid crystal display (LCD) panels. QRs, furthermore, features optical anisotropy which is not possessed by general QD materials. When applied to LCD panels, it raises the degree of polarization of light, and, comparing with QD materials, further enhances the transmittance of the LCD panel.

Alignment of QRs is needed in most application processes. Currently, the QRs are aligned by thin film extension technology, which requires independent production of extension thin films and introduction of extension technology. The production process is more complicated and the cost is expensive, but the QR alignment efficiency is low.

Therefore, it is necessary to provide a substrate and a method of forming a photoresist layer to solve problems with the existing technology.

SUMMARY OF THE INVENTION

An object of the present invention is to provide a substrate and a method of forming a photoresist layer to solve such technical problems as complicated QR alignment process and low alignment efficiency.

According to the present invention, a method of forming a photoresist layer, comprises: forming alignment electrodes on a base through lithography, wherein when the alignment electrodes are applied with positive and negative voltages, a horizontal electric field is produced; mixing color quantum rods (QRs) and photoresist to form a mixed material; coating the mixed material on the base installed with the alignment electrodes, wherein the color QRs, comprising red, green and blue QRs, have long axes; applying the base coated with the mixed material with positive and negative voltages so that the long axes of the color QRs align horizontally under the effect of the horizontal electric fields generated by the alignment electrodes; vacuum-drying the base coated with the mixed material to enhance the viscosity of the photoresist; interrupting electricity at a designated point to form a photoresist layer, wherein the long axes of QRs remain aligned horizontally; when the photoresist layer is disposed on the color film substrate, the color film substrate comprises color resist films, comprising red, green and blue color resist films; when a backlight source emits blue light to the color film substrate, a color filter is disposed on top of the red color film to filtrate the blue light.

Furthermore, the photoresist is a resin photoresist, and the step of mixing color quantum rods (QRs) and photoresist to form a mixed material comprises: blending the red, green and blue QRs with the resin photoresist. The method after vacuum-drying the base coated with the mixed material, further comprises: baking the vacuum-dried mixed material by 230° C. for 25 to 35 minutes so that the resin photoresist is fully solidified.

Furthermore, the photoresist is color photoresists, comprising red, green and blue photoresists. The method after forming alignment electrodes on the base through lithography, further comprises: forming a black matrix on the base installed with alignment electrodes; mixing the QRs with the photoresist of corresponding color to form a mixed material; coating the mixed material on the base installed with the black matrix. The method after vacuum-drying the base coated with the mixed material, further comprises: patterning the mixed material to form color resist films.

Furthermore, a first polarizer is disposed on an external side of the color film substrate, and a polarization direction of the first polarizer is the same as the direction of the long axes of the QRs.

According to the present invention, a method of forming a photoresist layer, comprises: forming alignment electrodes on a base through lithography, wherein when the alignment electrodes are applied with positive and negative voltages, a horizontal electric field is produced; mixing color quantum rods (QRs) and photoresist to form a mixed material; coating the mixed material on the base installed with the alignment electrodes, wherein the color QRs, comprising red, green and blue QRs, have long axes; applying the base coated with the mixed material with positive and negative voltages so that the long axes of the color QRs align horizontally under the effect of the horizontal electric fields generated by the alignment electrodes; vacuum-drying the base coated with the mixed material to enhance the viscosity of the photoresist; and interrupting electricity at a designated point to form a photoresist layer, wherein the long axes of QRs remain aligned horizontally.

Furthermore, the photoresist is a resin photoresist, and the step of mixing color quantum rods (QRs) and photoresist to form a mixed material comprises: blending the red, green and blue QRs with the resin photoresist. The method after vacuum-drying the base coated with the mixed material, further comprises: baking the vacuum-dried mixed material by 230° C. for 25 to 35 minutes so that the resin photoresist is fully solidified.

Furthermore, the photoresist is color photoresists, comprising red, green and blue photoresists. The method after forming alignment electrodes on the base through lithography, further comprises: forming a black matrix on the base installed with alignment electrodes; mixing the QRs with the photoresist of corresponding color to form a mixed material; coating the mixed material on the base installed with the black matrix. The method after vacuum-drying the base coated with the mixed material, further comprises: patterning the mixed material to form color resist films.

Furthermore, the photoresist layer is disposed on a color film substrate or an array substrate.

Furthermore, when the photoresist layer is disposed on the color film substrate, the color film substrate comprises color resist films, comprising red, green and blue color resist films. When a backlight source emits blue light to the color film substrate, a color filter is disposed on top of the red color film to filtrate the blue light.

Furthermore, when the photoresist layer is disposed on the color film substrate, a first polarizer is disposed on an external side of the color film substrate, and a polarization direction of the first polarizer is the same as the direction of the long axes of the QRs.

Furthermore, when the photoresist layer is disposed on the array substrate, a second polarizer is disposed on the furthermost side of the array substrate, and the photoresist layer is disposed on an external side of the second polarizer.

Furthermore, the alignment electrodes comprise: a first electrode, comprising a first common portion and a plurality of first main portions, all of the plurality of first main portions connected to the first common portion; and a second electrode, comprising a second common portion and a plurality of second main portions, all of the plurality of second main portions connected to the second common portion; the plurality of first main portions being parallel to the plurality of second main portions, the first common portion corresponding to the second common portion.

According to the present invention, a substrate comprises: a base; a photoresist layer, disposed on the base, wherein materials for the photoresist layer are mixed with color QRs, comprising red, green and blue QRs; the color QRs have long axes, which are aligned horizontally; the photoresist layer comprises a plurality of photoresist units, which comprise areas where QRs of at least one color locate; alignment electrodes, locating on both sides of the photoresist units, to be used to generate a plurality of horizontal electric fields when the base is applied with positive and negative voltages.

Furthermore, materials for the photoresist layer is resin photoresist.

Furthermore, materials for the photoresist layer is color photoresists, comprising red, green and blue photoresists.

Furthermore, a polarizer is disposed on an external side of the substrate, and the polarization direction of the polarizer is the same as the direction of the long axes of the QRs.

Furthermore, when the substrate is an array substrate, a second polarizer is disposed on the furthermost side of the array substrate, and the photoresist layer is disposed on an external side of the second polarizer.

Furthermore, the alignment electrodes comprise: a first electrode, comprising a first common portion and a plurality of first main portions, all of the plurality of first main portions connected to the first common portion; and a second electrode, comprising a second common portion and a plurality of second main portions, all of the plurality of second main portions connected to the second common portion; the plurality of first main portions being parallel to the plurality of second main portions, the first common portion corresponding to the second common portion.

Furthermore, when the substrate is a color film substrate, the color film substrate comprises color resist films, comprising red, green and blue color resist films. When a backlight source emits blue light to the color film substrate, a color filter is disposed on top of the red color film to filtrate the blue light.

The substrate and method of forming a photoresist layer of the present invention is to apply extra electric fields to align QRs and bind QRs after they are electric-field-aligned by making use of the high viscosity of photoresist. It enhances color saturation and gamut of LCD panels while simplifying the production process, reducing production cost and improving alignment efficiency.

DETAILED DESCRIPTION OF THE PREFERRED EMBODIMENTS

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 4:
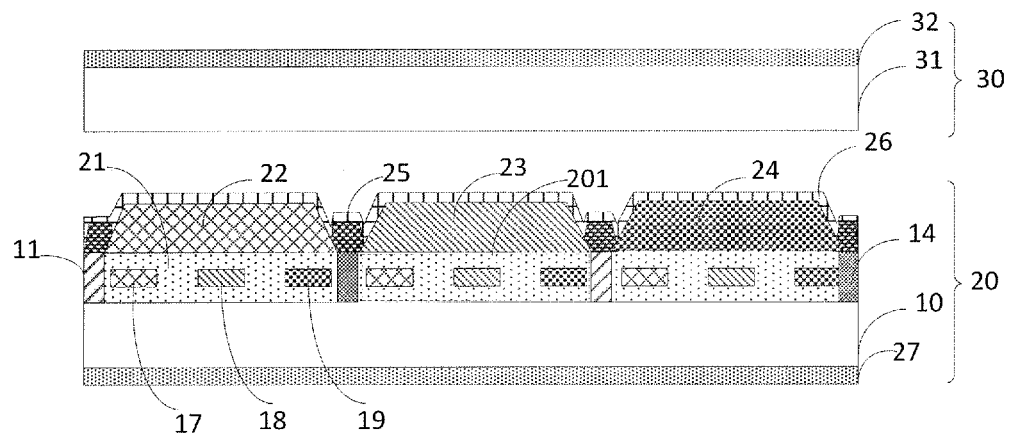
FIG. 4 is a schematic diagram of a liquid crystal display panel according to a first embodiment of the present invention.

Please refer to FIG. 4, which shows a structure diagram of a LCD panel of a first embodiment of the present invention.

A method of forming a photoresist layer of the present embodiment comprises the following steps:

S101: form alignment electrodes on a substrate through lithography. The alignment electrodes are applied to generate a plurality of horizontal electric fields when the substrate is applied with positive and negative voltages.

Figure 1:
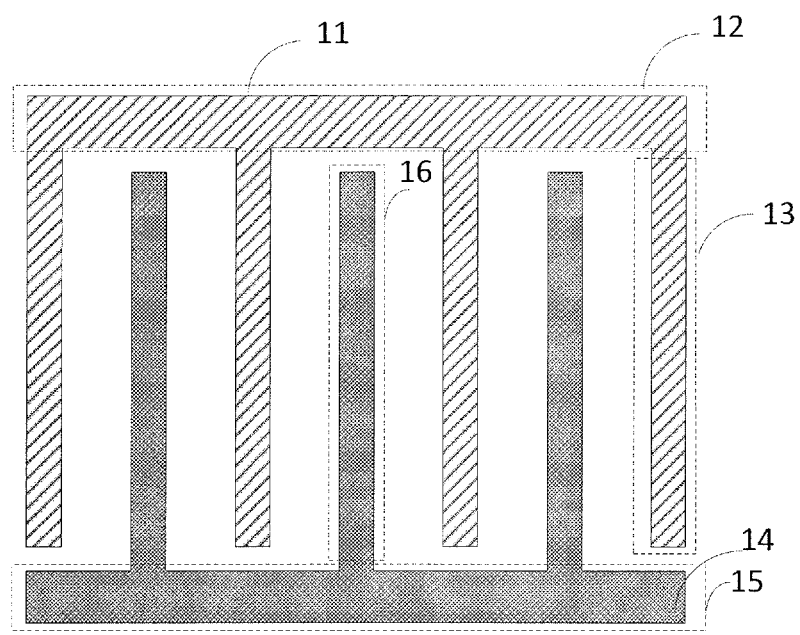
FIG. 1 is a schematic diagram of alignment electrodes according to preferred embodiment of the present invention.

The structure of the alignment electrodes is shown in FIG. 1. The alignment electrodes comprise a first electrode 11 and a second electrode 14. The first electrode 11 comprises a first common portion 12 (the horizontal bar) and a plurality of first main portions 13 (vertical bars). One end of all the first main portions 13 connects to the first common portion 12.

The second electrode 14 comprises a second common portion 15 and a plurality of second main portions 16. One end of all the second main portions 16 connects to the second common portion 15. The first common portion 12 and the second common portion 15 are disposed opposite to each other. The second main portions 16 and the first main portions 13 are disposed parallel to each other with a space between each vertical bar. The structure of the alignment electrode of the present embodiment is applicable to other embodiments.

S102: mix color QRs and resin photoresist evenly to form a mixed material. Coat the mixed material on the substrate installed with the alignment electrodes. The color QRs, having long axes, comprise red QRs 17, green QRs 18, and blue QRs 19.

Figure 2:
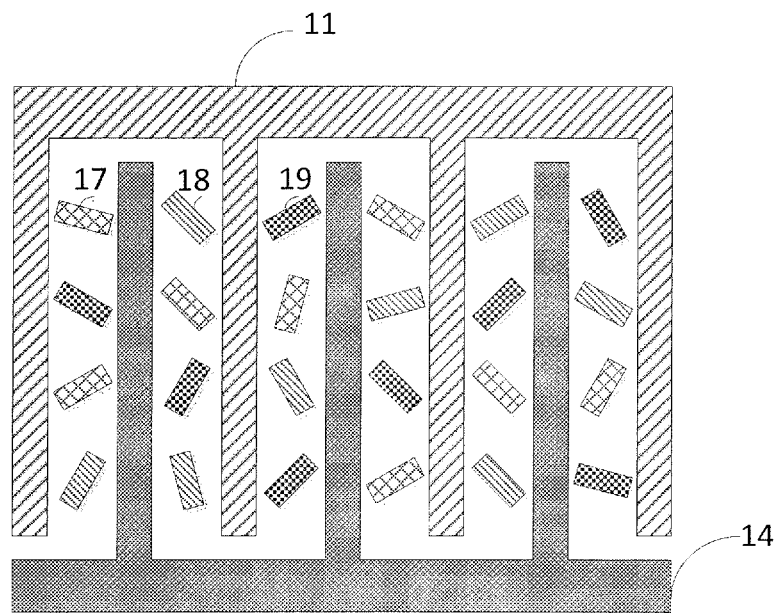
FIG. 2 shows alignment of quantum rods without applying electricity.

As shown in FIG. 2, mix the red QRs 17, green QRs 18 and blue QRs 19 evenly, and then blend the mix with resin photoresist. The resin photoresist can be OC transparent photoresist, which mainly composed of acrylic resin.

S103: electrify the substrate coated with the mixed material with positive and negative voltages, so that the long axes of the color QRs align horizontally under the effect of the horizontal electric fields generated by the alignment electrodes.

Figure 3:
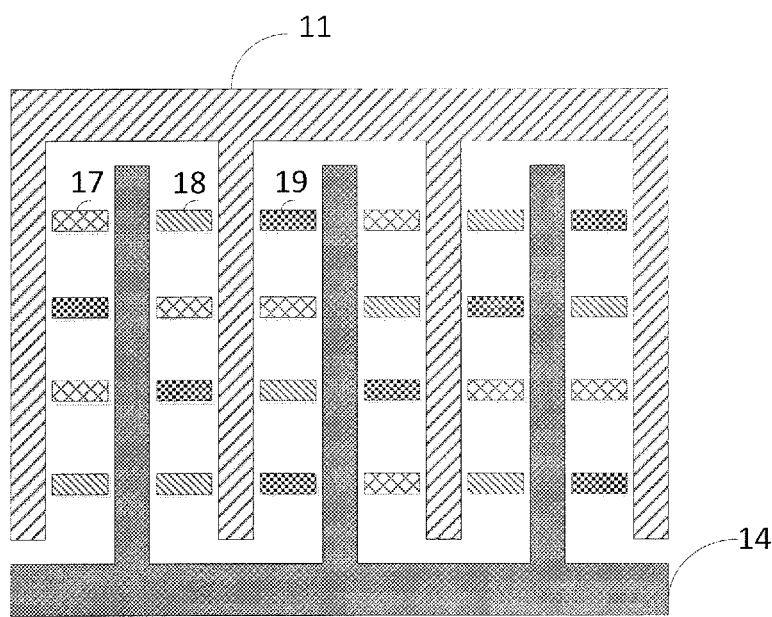
FIG. 3 shows alignment of quantum rods upon applying electricity.

When the substrate is not applied, the arrangement of color QRs is shown in FIG. 2. When the substrate is applied, as shown in FIG. 3, for example, by a positive voltage through the first electrode 11 of the alignment electrodes, and a negative voltage through the second electrode 14 of the alignment electrodes, a plurality of horizontal electric fields is generated on the panel. Therefore, the long axes of color QRs, previously in a messy arrangement, align horizontally.

S104: vacuum-dry the substrate coated with the mixed material, so to enhance the viscosity of the resin photoresist.

S105: interrupt the electricity at a designated point to form a photoresist layer. The long axes of QRs are aligned horizontally throughout the process.

After the electricity is interrupted, the long axes of the QRs will backtrack horizontally along their previous direction. However, because of the enhanced viscosity of the resin photoresist after it is vacuum-dried, it stops the tendency of QRs to backtrack to their previous arrangement, so that QRs remain in horizontal alignment.

S106: bake the vacuum-dried mixed material at 230° C. for 25 to 35 minutes, so that the resin photoresist can fully solidify.

The resin photoresist is solidified for the need of the production process afterwards. It is usually solidified by heating, preferably, for 25 to 35 minutes.

After step S106, a color resist film, black matrix, transparent conducting film or spacer can further be formed on the solidified photoresist layer.

As shown in FIG. 4, the photoresist layer of the present invention sits on a color film substrate 20. The LCD panel comprises the color film substrate 20, an array substrate 30, and a liquid crystal layer.

The color film substrate 20 comprises a base 10, and alignment electrodes disposed on the base 10. The alignment electrodes comprise the first electrode 11 and the second electrode 14. A photoresist layer 21, disposed on the base 10, comprises a plurality of photoresist units 201. The photoresist units 201 comprise areas where color QRs locate, e.g. areas where the red, green and blue QRs locate. The alignment electrodes locate on both sides of the photoresist units 201 (that is, the first and second electrodes are disposed correspondingly to their respective side of the photoresist units).

Materials (e.g. resin photoresist) for the photoresist layer 21 are mixed with color QRs. The color QRs have long axes, which are aligned horizontally.

A color resist layer, disposed on the photoresist layer 21, comprises a red color film 22, green color film 23 and blue color film 24. A black matrix 25 is disposed between two adjacent color resist films. A transparent conducting film 26 is disposed on the black matrix 25. In addition, a first polarizer 27 is installed on the furthermost side of the color film substrate 20. The direction of long axes of the color QRs is the same as the polarization direction of the first polarizer 17. More specifically, the directions of the long axes of red QRs 17, green QRs 18 and blue QRs 19 are the same as the polarization direction of the first polarizer 27.

The array substrate 30 comprises another substrate 31 and a second polarizer 32. The direction of the long axes of the color QRs is perpendicular to the polarization direction of the second polarizer 32. A switch array later is installed on an inner side (close to the liquid crystal layer) of the array substrate 30. The switch array layer comprises a plurality of thin film transistors.

The backlight source of the LCD panel in the present embodiment can be blue or white.

Preferably, a color filter is disposed on top of the red color film when the backlight source received by the color film substrate is blue, so that the color filter can filtrate the blue light. After the red QRs are activated by the blue backlight, the remaining blue light will lower the color purity of the red light, leading to a reduction in color saturation. After the blue light color filter is added, the effect of the remaining blue light can be avoided effectively.

Figure 10:
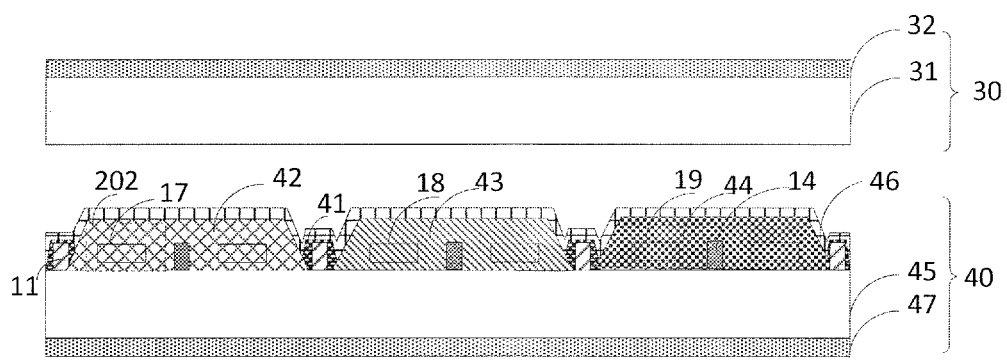
FIG. 10 is a first schematic diagram of a liquid crystal display panel according to the second embodiment of the present invention.

Please refer to FIG. 10, showing a structure diagram of a LCD panel of a second embodiment of the present invention.

A method of forming a photoresist layer of the present embodiment comprises the following steps:

S201: form alignment electrodes on a substrate through lithography. The alignment electrodes are applied to produce a plurality of horizontal electric fields when the substrate is applied with positive and negative voltages.

Please refer to FIG. 1 for specific structure of the alignment electrodes.

S202: form a black matrix on the substrate installed with the alignment electrodes.

Figure 5:
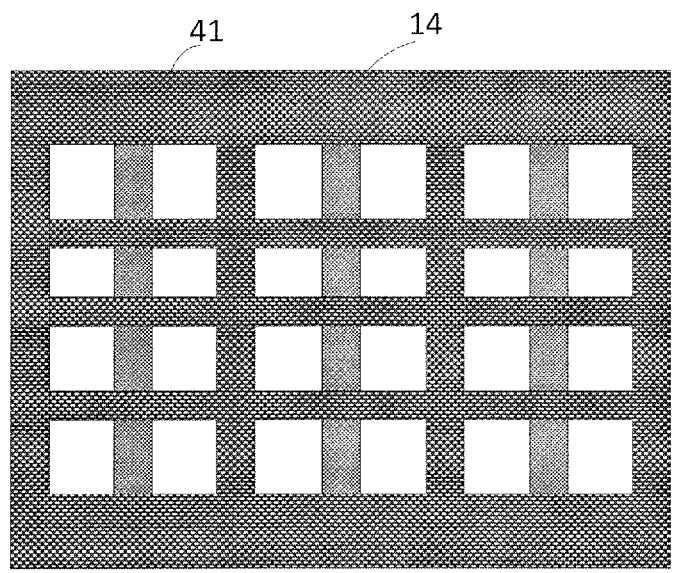
FIG. 5 is a top view of a black matrix according to a second embodiment of the present invention.
Figure 6:
FIG. 6 is a schematic diagram of a black matrix according to the second embodiment of the present invention.

Please refer to FIG. 5 and FIG. 6 for the arrangement of the black matrix on the substrate. The black matrix 41 can be corresponding to the positions of scan lines and data lines. The vertical parts of the black matrix shield first main portions of a first electrode.

S203: mix color QRs and resin photoresist to form a mixed material. Coat the mixed material on the substrate installed with the black matrix. More specifically, it comprises:

S301: mix red QRs with red photoresist, green QRs with green photoresist, and blue QRs with blue photoresist.

S302: coat the mix of red QRs and red photoresist on the substrate installed with the black matrix. Electrify the substrate with positive/negative voltages, so that the long axes of the red QRs align along the direction of the horizontal electric fields under the effect of the horizontal electric fields generated by the alignment electrodes.

Figure 7:
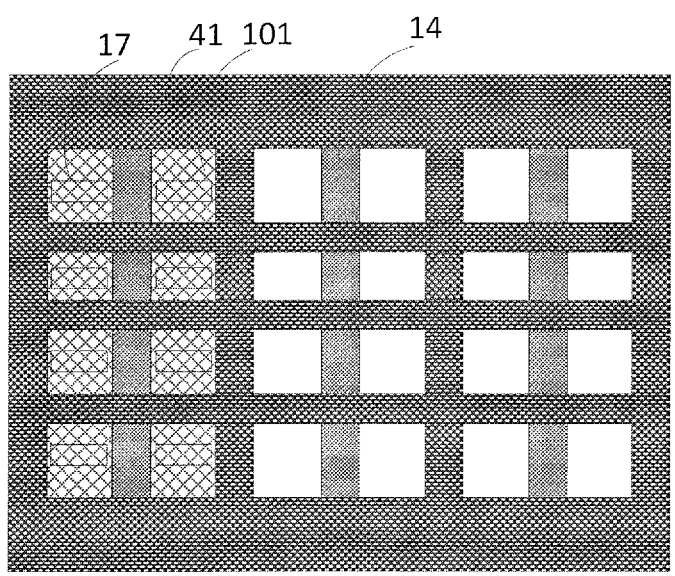
FIG. 7 is a diagram of aligned red quantum rods according to the second embodiment of the present invention.

Please refer to FIG. 7. The mix of red QRs 17 and red photoresist 101 is coated on the substrate 45 installed with the black matrix 41.

S303: vacuum-dry the substrate to enhance the viscosity of the red photoresist, so that the direction of the long axes of the red QRs can remain the same as the direction of the horizontal electric fields after the electricity is interrupted.

S304: form a red color film by patterning the red photoresist.

Figure 8:
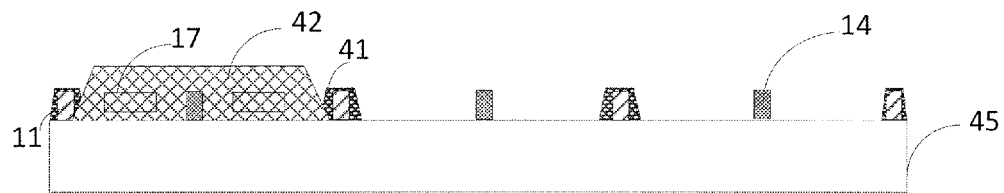
FIG. 8 is a diagram of a red color film according to the second embodiment of the present invention.

Please refer to FIG. 8. The red color film 42 is formed after exposing and developing the red photoresist 101.

After the red color film is formed, form green and blue color films. The forming of red, green or blue color films does not follow a specific sequence.

S305: coat the mix of green QRs and green photoresist on the substrate.

Figure 9:
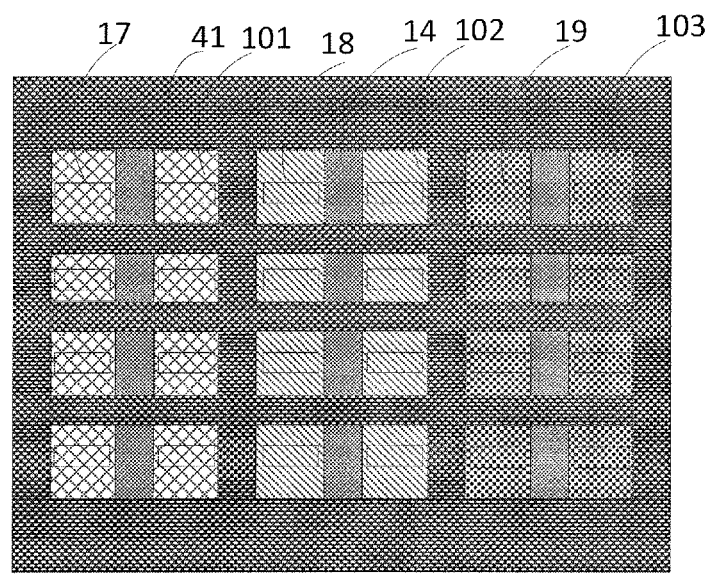
FIG. 9 is a diagram of aligned color quantum rods according to the second embodiment of the present invention.

Please refer to FIG. 9. Coat the mix of green QRs 18 and green photoresist 102 on the substrate installed with the black matrix 41.

S306: electrify the substrate with positive/negative voltages, so that the long axes of the green QRs align along the direction of the horizontal electric fields under the effect of the horizontal electric fields generated by the alignment electrodes.

S307: vacuum-dry the substrate to enhance the viscosity of the green photoresist, so that the direction of the long axes of the green QRs can remain the same as the direction of the horizontal electric fields after the electricity is interrupted.

S308: form a green color film by patterning the green photoresist.

Please refer to FIG. 10. The green color film 43 is formed after exposing and developing the green photoresist 102.

S309: coat the mix of blue QRs and blue photoresist on the substrate.

Please refer to FIG. 9. Coat the mix of blue QRs 19 and blue photoresist 103 on the substrate installed with the black matrix 41.

S310: electrify the substrate with positive/negative voltages, so that the long axes of the blue QRs align along the direction of the horizontal electric fields under the effect of the horizontal electric fields generated by the alignment electrodes.

S311: vacuum-dry the substrate to enhance the viscosity of the blue photoresist, so that the direction of the long axes of the blue QRs can remain the same as the direction of the horizontal electric fields after the electricity is interrupted.

S312: form a blue color film by patterning the blue photoresist.

Please refer to FIG. 10. The blue color film 44 is formed after exposing and developing the blue photoresist 103.

A transparent conducting layer 46 or spacer can further be formed on the color resist films after step S312.

As shown in FIG. 10, the photoresist layer of the present invention is disposed on the color film substrate. The LCD panel comprises the color film substrate 40, the array substrate 30 and the liquid crystal layer.

The color film substrate 40 comprises a substrate 45 and alignment electrodes disposed on the substrate 45. The alignment electrodes comprise a first electrode 11 and a second electrode 14. Photoresist layers 42 to 44 are disposed on the substrate 45. The photoresist layer 21 comprises a plurality of photoresist units 202 (e.g. the part circled by dotted-lines). The photoresist units 202 comprise areas where QRs of a specific color locate, e.g. areas where the red QRs locate. The alignment electrodes locate on both sides of the photoresist units 202 (that is, the first and second electrodes are disposed correspondingly to their respective side of the photoresist units). The materials for the photoresist layers (e.g. color photoresist) are mixed with color QRs. The color QRs have long axes, which are aligned horizontally.

A transparent conducting layer 46 is disposed on photoresist layers 42 to 44. In addition, a first polarizer 47 is installed on the furthermost side of the color film substrate. The direction of long axes of the color QRs is the same as the polarization direction of the first polarizer 47. More specifically, the direction of the long axes of red QRs 17, green QRs 18 and blue QRs 19 are the same as the polarization direction of the first polarizer 47.

The array substrate 30 comprises another substrate 31 and a second polarizer 32. The direction of the long axes of the color QRs is perpendicular to the polarization direction of the second polarizer 32.

The backlight source of the LCD panel in the present embodiment can emit blue or white light.

Figure 11:
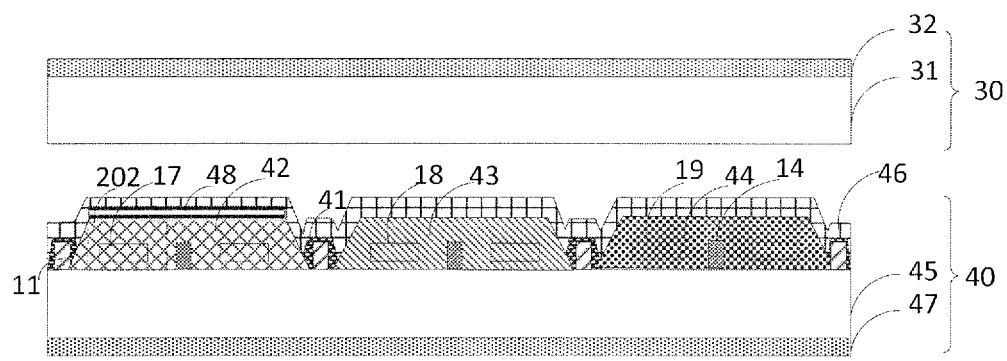
FIG. 11 is a second schematic diagram of a liquid crystal display panel according to the second embodiment of the present invention.

Please refer to FIG. 11. A color filter 48 is disposed on top of the red color film 42 when the backlight source received by the color film substrate 40 is blue, so that the color filter 48 can filter the blue light. After the red QRs are activated by the blue backlight, the remaining blue light will lower the color purity of the red light, leading to a reduction in color saturation. After the blue light color filter is added, the effect of the remaining blue light can be avoided effectively.

Figure 12:
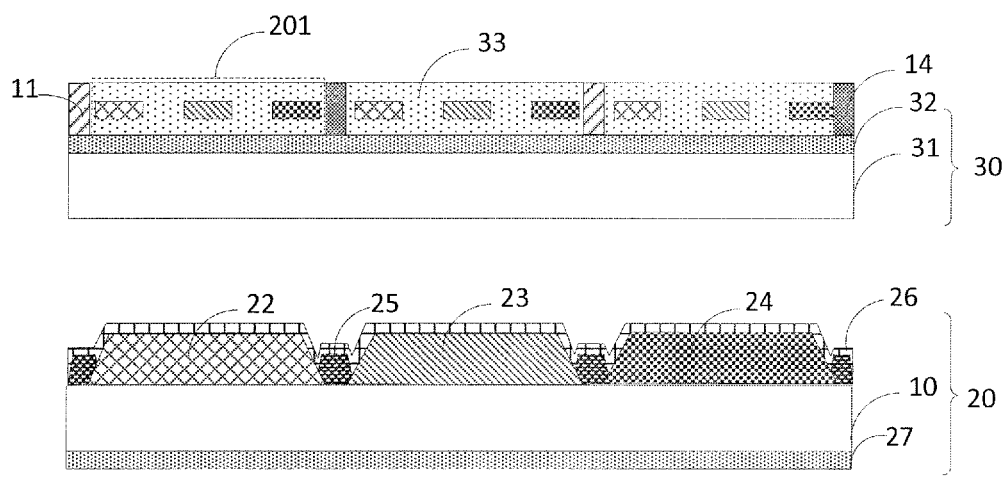
FIG. 12 is a schematic diagram of a liquid crystal display panel according to the third embodiment of the present invention.

Please refer to FIG. 12, showing a structure diagram of a LCD panel of a third embodiment of the present invention.

The difference between the present and the first embodiment is that the photoresist layer 33 is disposed on the array substrate 30. Preferably, the array substrate 30 comprises another substrate 31 and a second polarizer 32. The direction of the long axes of the color QRs is the same as the polarization direction of the second polarizer 32. The long axes of the color QRs are perpendicular to the polarization direction of the first polarizer 27 on the color film substrate 20.

The substrate and the method of forming a photoresist layer of the present invention align QRs by adding extra electric fields. The QRs alignment is attained to by making use of the high viscosity of photoresists to bind the electric-field-aligned QRs after the electricity is interrupted. The present invention also makes use of the anisotropy of QRs to enhance the color saturation and gamut of LCD panels. In addition, the present invention also simplifies the production process, reduces production cost and improves alignment efficiency, as it does not need independent production of extension thin films nor introduction of extension technology.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. A method of forming a photoresist layer, comprising:
   forming alignment electrodes on a base through lithography, wherein when the alignment electrodes are applied with positive and negative voltages, a horizontal electric field is produced;
   mixing color quantum rods (QRs) and photoresist to form a mixed material; coating the mixed material on the base installed with the alignment electrodes, wherein the color QRs, comprising red, green and blue QRs, have long axes;
   applying the base coated with the mixed material with positive and negative voltages so that the long axes of the color QRs align horizontally under the effect of the horizontal electric fields generated by the alignment electrodes;
   vacuum-drying the base coated with the mixed material to enhance the viscosity of the photoresist;
   interrupting electricity at a designated point to form a photoresist layer, wherein the long axes of QRs remain aligned horizontally;
   when the photoresist layer is disposed on the color film substrate, the color film substrate comprises color resist films, comprising red, green and blue color resist films;

when a backlight source emits blue light to the color film substrate, a color filter is disposed on top of the red color film to filtrate the blue light.

2. The method of claim 1, wherein the photoresist is a resin photoresist, and the step of mixing color quantum rods (QRs) and photoresist to form a mixed material comprises:
blending the red, green and blue QRs with the resin photoresist;
the method after vacuum-drying the base coated with the mixed material, further comprising:
baking the vacuum-dried nixed material by 230° C. for 25 to 35 minutes so that the resin photoresist is fully solidified.

3. The method of claim 1, wherein the photoresist is color photoresists, comprising red, green and blue photoresists;
the method after forming alignment electrodes on the base through lithography, further comprising:
forming a black matrix on the base installed with alignment electrodes;
mixing the QRs with the photoresist of corresponding color to form a mixed material;
coating the mixed material on the base installed with the black matrix;
the method after vacuum-drying the base coated with the mixed material, further comprising:
patterning the mixed material to form color resist films.

4. The method of claim 1, wherein a first polarizer is disposed on an external side of the color film substrate, and a polarization direction of the first polarizer is the same as the direction of the long axes of the QRs.

5. A method of forming a photoresist layer, comprising:
forming alignment electrodes on a base through lithography, wherein when the alignment electrodes are applied with positive and negative voltages, a horizontal electric field is produced;
mixing color quantum rods (QRs) and photoresist to form a mixed material; coating the mixed material on the base installed with the alignment electrodes, wherein the color QRs, comprising red, green and blue QRs, have long axes;
applying the base coated with the mixed material with positive and negative voltages so that the long axes of the color QRs align horizontally under the effect of the horizontal electric fields generated by the alignment electrodes;
vacuum-drying the base coated with the mixed material to enhance the viscosity of the photoresist; and
interrupting electricity at a designated point to form a photoresist layer, wherein the long axes of QRs remain aligned horizontally.

6. The method of claim 5, wherein the photoresist is a resin photoresist, and the step of mixing color quantum rods (QRs) and photoresist to form a mixed material comprises:
blending the red, green and blue QRs with the resin photoresist;
the method after vacuum-drying the base coated with the mixed material, further comprising:
baking the vacuum-dried mixed material by 230° C. for 25 to 35 minutes so that the resin photoresist is fully solidified.

7. The method of claim 5, wherein the photoresist is color photoresists, comprising red, green and blue photoresists;
the method after forming alignment electrodes on the base through lithography, further comprising:
forming a black matrix on the base installed with alignment electrodes;
mixing the QRs with the photoresist of corresponding color to form a mixed material;
coating the mixed material on the base installed with the black matrix;
the method after vacuum-drying the base coated with the mixed material, further comprising:
patterning the mixed material to form color resist films.

8. The method of claim 5, wherein the photoresist layer is disposed on a color film substrate or an array substrate.

9. The method of claim 5, wherein when the photoresist layer is disposed on the color film substrate, the color film substrate comprises color resist films, comprising red, green and blue color resist films;
when a backlight source emits blue light to the color film substrate, a color filter is disposed on top of the red color film to filtrate the blue light.

10. The method of claim 8, wherein when the photoresist layer is disposed on the color film substrate, a first polarizer is disposed on an external side of the color film substrate, and a polarization direction of the first polarizer is the same as the direction of the long axes of the QRs.

11. The method of claim 8, wherein when the photoresist layer is disposed on the array substrate, a second polarizer is disposed on the furthermost side of the array substrate, and the photoresist layer is disposed on an external side of the second polarizer.

12. The method of claim 5, wherein the alignment electrodes comprise:
a first electrode, comprising a first common portion and a plurality of first main portions, all of the plurality of first main portions connected to the first common portion; and
a second electrode, comprising a second common portion and a plurality of second main portions, all of the plurality of second main portions connected to the second common portion; the plurality of first main portions being parallel to the plurality of second main portions, the first common portion corresponding to the second common portion.

* * * * *